United States Patent [19]

Schwalke et al.

[11] Patent Number: 5,473,181
[45] Date of Patent: Dec. 5, 1995

[54] INTEGRATED CIRCUIT ARRANGEMENT HAVING AT LEAST ONE POWER COMPONENT AND LOW-VOLTAGE COMPONENTS

[75] Inventors: Udo Schwalke, Heldenstein; Michael Stoisiek, Ottobrunn, both of Germany

[73] Assignee: Siemens Aktiengesellschaft, Munich, Germany

[21] Appl. No.: 314,710

[22] Filed: Sep. 29, 1994

[30] Foreign Application Priority Data

Nov. 5, 1993 [DE] Germany ............... 43 37 873.0

[51] Int. Cl.$^6$ ............... H01L 27/00; H01L 29/78; H01L 23/54
[52] U.S. Cl. ............... 257/350; 257/287; 257/329; 257/383; 257/500; 257/502
[58] Field of Search ............... 257/262, 266, 257/270, 287, 329, 350, 351, 382–384, 500–502

[56] References Cited

U.S. PATENT DOCUMENTS

| | | | |
|---|---|---|---|
| 4,692,994 | 9/1987 | Moniwa et al. | 257/351 |
| 5,047,833 | 9/1991 | Gould | 257/383 |
| 5,051,808 | 9/1991 | Saito et al. | 257/370 |

FOREIGN PATENT DOCUMENTS

| | | | |
|---|---|---|---|
| 58-92254 | 6/1983 | Japan . | |
| 60-180169 | 9/1985 | Japan | 257/383 |
| 61-180466 | 8/1986 | Japan | 257/350 |
| 63-155653 | 6/1988 | Japan . | |
| 3022432 | 1/1991 | Japan . | |
| 4113679 | 4/1992 | Japan . | |
| 4318972 | 11/1992 | Japan . | |

OTHER PUBLICATIONS

Terukazu, O. et al, "An Intelligent Power IC with Double Buried-Oxide Layers Formed by Simox Technology," IEEE Transactions on Electron Devices, vol. 40, No. 11, Nov. 1993, pp. 2074–2080.
Article "Silicon–On–Insulator Approach for Power IC's Integrating Vertical DMOS and Polycrystalline–Silicon CMOS Thin–Film Transistors", 8179 IEEE Electron Device Letters, 13 (1992) Oct., No. 10, N.Y., Dolny, pp. 516–518.
1987 IEEE, "SOI Photodiode Array Stacked on VDMOS For Optical Switching", Kioi et al, IEDM 1987, Dec. 1987, pp. 460–463.
Elektronik, Mar. 4, 1988, Dipl.–Phys. Hartmut Steinberger "3D–ICs: Entwicklungstrends", pp. 83–86.
IEEE Electron Device Letters, vol. EDL–7, No. 1, Jan., 1986, M. W. Geis et al "Use of Zone–Melting Recrystallization to Fabricate a Three–Dimensional Structure Incorporating Power Bipolar and Field–Effect Transistors", pp. 41–43.
Electronic Design, Jan. 9, 1992, Dave Bursky, "Process Advancements Fuel IC Developments", Improvements in Lithography, Etching, and Deposition Hold the Key.
Elektronik, Oct. 8, 1982, Brian R. Pelly, "Leistungshalbleiter—ein Uberblick", pp. 71–75.
IEEE, 1991, Akio Nakagawa—"Impact of Dielectric Isolation Technology on Power ICs", pp. 16–21.
Proc. ESSDERC 93, pp. 879–882—B. Mutterlein et al, "An Intelligent 600 V Vertical IGBT on Simox Substrate".
ECS 89 (1989), C. Cahill et al "A Novel Approach to Smart Power System Integration", pp. 324–333.
ECS '92, Abstract No. 321—Francine Y. Robb et al, "Thin Film Polysilicon Transistor for Power Applications", pp. 467 and 468.

(List continued on next page.)

Primary Examiner—Mahshid Saadat
Attorney, Agent, or Firm—Hill, Steadman & Simpson

[57] ABSTRACT

In an integrated circuit arrangement having at least one power component and low-voltage components, the at least one power component is realized in a semiconductor substrate. At least one contact of the power component is arranged on a principal surface of the substrate. The contact is covered with an insulation layer at a surface of which at least one thin-film component, particularly a thin-film transistor, is provided above the contact.

9 Claims, 2 Drawing Sheets

OTHER PUBLICATIONS

IEEE, 1992—G. M. Dolny et al "Polycrystalline–Silicon Thin–Film Transistor Technology for Low Cost, High–Power Integrated Circuits", pp. 9.3.1–9.3.4.

IEE Publishing, U.K., Reprinted from Electronics Letters, vol. 19, pp. 1095–1097, Dec., 1983, S. Nakashima et al, "Subscriber Line Interface Circuit LSI Fabricated Using High–Voltage CMOS/Simox Technology".

IEEE Electron Device Letters, vol. 14, No. 3, Mar., 1993, Horng Nan Chern et al, "$H_2/O_2$ Plasma on Polysilicon Thin–Film Transistor".

INTEGRATED CIRCUIT ARRANGEMENT HAVING AT LEAST ONE POWER COMPONENT AND LOW-VOLTAGE COMPONENTS

BACKGROUND OF THE INVENTION

What are understood by smart power ICs are integrated circuit arrangements that comprise a combination of power ICs and an "intelligent part" that comprises logic modules or sensor modules or the like. Whereas the power ICs are usually operated with higher voltages above 100 volts, usually around 500 volts, the intelligent part comprises low-voltage components that are operated at voltage levels around 5 volts. It is therefore necessary to electrically separate the power ICs from the low-voltage components. For example, MOSFETs, IGBTs (insulated gate bipolar transistor), MCT (MOS controlled thyristor) and the like are employed as power ICs.

The insulation between power ICs and the low-voltage components should avoid disturbances in the intelligent part due to electrical fields and/or minority carrier injection, optimally preventing these. This insulation is often realized as a dielectric insulation.

For this purpose, I. Nakagawa, ISPSD 91, p. 16 discloses that the dielectric insulation be produced on an SOI substrate that is manufactured according to the DWB (direct wafer bonding) or SDB (silicon wafer direct bonding) method. The components are realized in the silicon layer of the SOI substrate. The individual components are insulated from one another by an insulating trench that completely surrounds the respective component and that extends to the insulating layer of the SOI substrate. Both power components as well as low-voltage components are provided next to one another in the silicon layer of the SOI substrate. The component area is thus composed of the respective areas occupied by the power component and by the intelligent part. There is also the risk of a disturbance of the intelligent part due to capacitative influences.

B. Mütterlein et al., Proc. ESSDERC 93, pp. 879–882 discloses that power components and low-voltage components are integrated in a substrate, whereby oxygen is locally implanted in the region of the low-voltage components for insulation between the power components and the low-voltage components, an SIMOX substrate thus arising. The area requirements of the resulting circuit given this technique are likewise equal to the sum of the areas of the sub-circuits. Capacitive disturbances on the low-voltage components are even more pronounced here.

Cahill et al., ECS 89, p. 324 (1989) discloses that power components are realized in a silicon substrate. Neighboring power components are insulated from one another by field oxide regions that, for example, are manufactured in a LOCOS process. Subsequently, the surface of the substrate is provided with an insulating layer. A polysilicon layer that is recrystallized by zone melting is applied on the insulating layer. Thin-film MOS transistors are realized in the recrystallized silicon layer. The thin-film MOS transistors are arranged above the field oxide regions between the power component. Here, too, the area requirements are composed of the area for the intelligent part and the area for the power part.

F. Robb et al., ECS 92 Conference Proc. p. 467 and G. M. Dolny et al., IEDM 92 Conf. Proc., p. 233 disclose that power components are integrated in a silicon substrate and MOS thin-film transistors are realized in a polycrystalline silicon layer for the intelligent part. The polysilicon layer is arranged above insulation regions that separate the power components in the substrate. The thin-film transistors are then arranged above these insulation regions. In particular, it is possible to realize the thin-film transistors in the same polysilicon layer from which the gate electrodes for the power components are manufactured. The areas for the power components and the area for the intelligent part define the area of the component as a sum.

Nakashima et al., Electronics Lett. 19, p. 1095 (1983) discloses that high-voltage CMOS transistors are manufactured with a buried channel in an SIMOX substrate. For that purpose, a buried $SiO_2$ layer is formed by implantation of oxygen. In the same implantation step, a layer that shields the electrical field (electric field shielding layer) is formed between the $SiO_2$ layer and the transistor region by controlling the particle current during the implantation.

SUMMARY OF THE INVENTION

It is an object of the invention to specify a circuit arrangement having at least one power component and low-voltage components wherein the space requirements are reduced and wherein disturbances of the low-voltage components due to the power components are nonetheless avoided.

According to the invention, an integrated circuit arrangement is provided having at least one power component and a low-voltage component. The at least one power component is integrated in a semiconductor substrate. At least one contact of the power component is arranged on a principal surface of the substrate. An insulation layer covers the contact. At least one thin-film component as said low-voltage component is positioned above the contact so that the contact shields the thin-film component against electrical fields occurring in the substrate.

In the circuit arrangement of the invention, thin-film components are utilized as low-voltage components. Active and/or passive thin-film components are realized such as, in particular, thin-film transistors or thin-film capacitors. The thin-film components are manufactured of amorphous or of polycrystalline semiconductor material, particularly silicon. The thin-film transistors are preferably formed of polycrystalline silicon since the current yield and lifetime can be noticeably improved by corresponding thermal and/or plasma treatment (see, for example, H. N. Chern et al., EDL, vol. 14, p. 115).

At least one power component is integrated in a semiconductor substrate of, in particular, silicon and has at least one contact that is arranged on the principal surface of the substrate. The contact is covered with an insulation layer. At least one thin-film component is realized above the contact. The thin-film component is insulated from the contact by the insulation layer. The contact shields the thin-film component against electrical fields occurring in the substrate. The thin-film component is thereby arranged above the contact such that the projection of the area of the thin-film component encounters the contact.

During operation of the integrated circuit arrangement, the contact is preferably interconnected such that it is not subject to any, or to only extremely slight, voltage variations. As a result thereof, the contact effectively shields the thin-film component from the substrate. This is the case, for example, when the power component is a MOS-controlled component having a source region and the contact forms the source electrode. The cathode of a power component is also subject to essentially no voltage variations during operation.

Since the thin-film components are arranged above the power component in the circuit arrangement of the invention, they do not require any additional area. Power components comprise an extremely large usable surface of, typically, 0.5–4 cm$^2$, so that complicated thin-film circuits can also be realized on this area. Complicated thin-film circuits are required, for example, when extremely complex logic functions are to be integrated, when high currents are required for driving, as is the case given fast switches, or when the current yield is reduced due to the crystal quality.

Power components are frequently realized in the form of a cell structure. In the case of a MOS-controlled power component with a source region, a plurality of source regions are regularly arranged such that they join a principal surface of a substrate. Furthermore, the source regions are embedded into doped regions that respectively encompass a channel region. A gate dielectric is arranged at the principal surface of the substrate above the channel region and a gate electrode is arranged on the gate dielectric. The doped regions that encompass the channel regions are in turn embedded in an oppositely doped drift region that defines the dielectric strength of the component. The drift region has that side facing away from the source region adjoining a more highly doped region, a drain region given a power MOSFET or an emitter region given an IGBT that is contacted proceeding from that surface of the substrate facing away from the principal surface, or is contacted to the side of the drain structure via a buried layer. The gate electrodes on the principal surface of the substrate that are connected to one another are completely covered by an insulating layer on which a source metallization is arranged. The source metallization is a connection level that comprises contacts to the source region in the substrate. In the case of such a MOS-controlled power component with a cell structure, the insulating layer in the integrated circuit arrangement is applied surface-wide onto the source metallization. The source metallization then serves as a shielding layer against electrical fields that are caused by the power component.

The temperature stress in the manufacture of thin-film components is so low that the basic process of the power component remains essentially unaltered. The source metallization must merely be selected such that it resists the temperature stress. Only standard methods of CMOS technology are employed for manufacturing the circuit structure of the invention.

It is especially advantageous to provide the insulation layer with a planar surface, since the manufacture is then facilitated for thin-film components. The planar surface of the insulation layer is preferably manufactured on the basis of an electrochemical polishing method.

DESCRIPTION OF THE PREFERRED EMBODIMENTS

Figure 1:
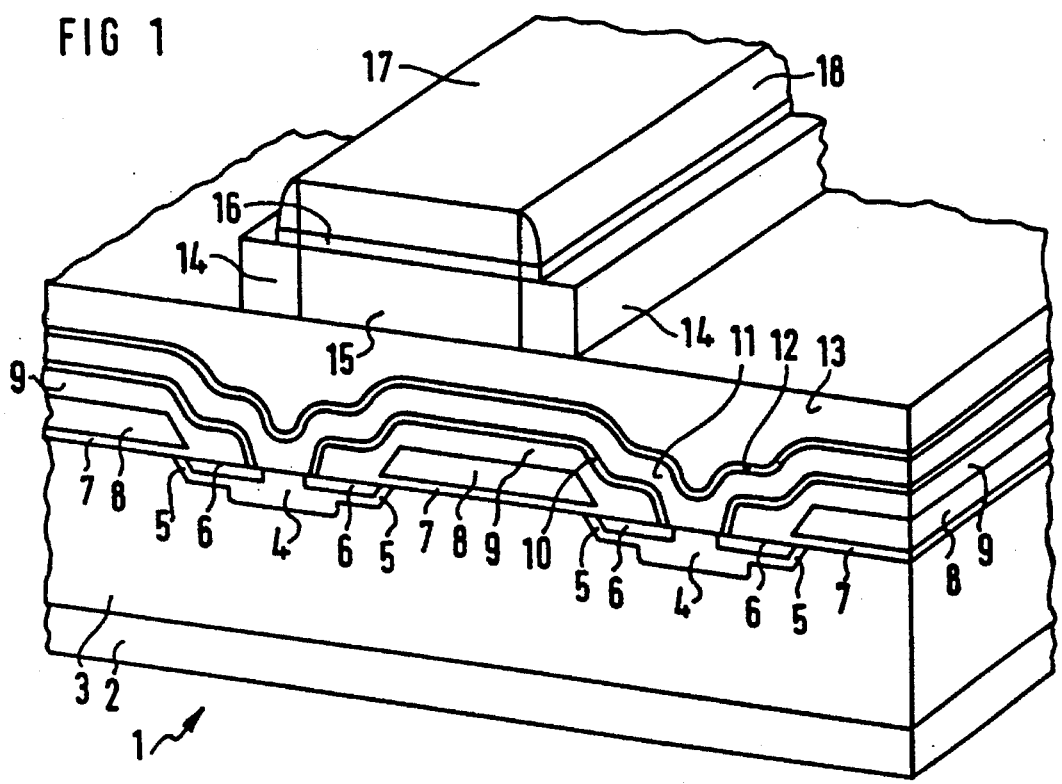
FIG. 1 shows a circuit arrangement having a thin-film transistor that is arranged above the source metallization of a power MOSFET.

A power MOSFET is realized in a substrate 1. For that purpose, the substrate 1 of single-crystal silicon comprises a drain region 2 that is n$^+$-doped in the example, and comprises an n$^-$-doped region 3 that defines the dielectric strength of the power MOSFET (see FIG. 1). Pre-doped regions 4 that respectively encompass channel regions 5 that adjoin the principal surface are embedded into the n-doped region 3 at a principal surface of the substrate 1 that lies opposite the drain region. Source regions 6 that are n$^+$-doped are arranged in the p-doped regions 4, these source regions 6 adjoining the principal surface such that the channel regions 5 adjoin the principal surface respectively between source region 6 and n$^-$-doped region 3, and such that the p-doped regions 4 likewise adjoin the principal surface at that side of the source regions 6 facing away from the channel regions 5.

A gate dielectric 7 is arranged in the region of the channel regions 5 at the principal surface of the substrate 1 which is facing away from the drain region. The gate dielectric 7 is composed, for example, of 80 nm thick SiO$_2$. A gate electrode 8 is arranged above the gate dielectric 7, this gate electrode 8 being designed as an interrelated structure so that all gate electrodes are electrically connected to one another. The gate electrode 8 is composed, for example, of p$^+$-doped or n$^+$-doped polysilicon that comprises a thickness of, for example, 500 nm.

The gate electrode 8 is completely covered by an insulating layer 9. The insulating layer 9 is composed, for example, of SiO$_2$ and is structured such that the surface of the source region 6 as well as of the p-doped regions 4 is at least partially uncovered in the region of the principal surface lying opposite the drain region 2. The surface of the insulating layer 9 is covered with a lower passivation layer 10 of, for example, titanium nitride.

A source metallization level 11 is arranged on the lower passivation layer 10 and on the partially uncovered surfaces of the source regions 6 as well as of the p-doped region 4. The source metallization level 11 is composed of, for example, tungsten or of a metal silicide. The source metallization level 11 contacts the source region 6 and the p-doped regions 4. It connects the source regions 6 to the p-doped regions 4 that represent an inner substrate in the power MOSFET. Beyond this, the source metallization layer 11 connects all source regions 6 and p-doped regions 4 to one another and applies them to the same potential.

The surface of the source metallization level 11 is covered with an upper passivation layer 12 that, for example, is composed of nitride. The upper passivation layer 12 is intended to avoid reactions between the source metallization level and the SiO$_2$, these particularly occurring in the case of tungsten.

An insulation layer 13 that comprises a planar surface on that surface of the layer structure facing away from the drain region 2 is arranged on the upper passivation layer 12. The insulation layer 13 is composed, for example, of undoped SiO$_2$, of doped glass, particularly borophosphorous silicate glass, or of a combination of SiO$_2$, and borophosphorous silicate glass. In order to improve the surface quality, further dielectric layers of SiO$_2$ or of Si$_3$N$_4$ (not shown) can be arranged at the surface of the insulation layer 13.

At least one passive or active thin-film component, for example, a thin-film transistor, is arranged on the planar surface of the dielectric insulation layer 13. The thin-film transistor comprises source/drain regions 14 of doped polysilicon and a polysilicon body 15 that is arranged at the surface of the dielectric insulation layer 13 between source/drain regions 14 lying opposite one another. The silicon body 15 represents the internal substrate of the thin-film transistor. Upon activation of the thin-film transistor, a conductor channel is formed in the polysilicon body 15. A gate dielectric 16 of, for example, $SiO_2$, is arranged at the surface of the polysilicon body 15. A gate electrode 17 of, for example, doped polysilicon, is arranged on the gate dielectric 16. Insulating spacers 18 are arranged at the side walls of the gate electrode 17 and the gate dielectric 16 that proceed essentially perpendicularly relative to the surface of the dielectric insulation layer 13. The insulating spacers 18 are composed, for example, of $SiO_2$.

The thin-film transistor is arranged above the source metallization level 11 of the power MOSFET, whereby the insulation layer 13 serves the purpose of insulation. A thin-film circuit usually has a voltage in the proximity of the source potential during operation of the power MOSFET. The source metallization layer 11 shields the thin-film transistor against what are in part substantial voltage variations in the substrate 1, and secures an undisturbed functioning of the thin-film transistor.

Since power MOSFETs as well as other power components comprise an extremely large usable surface of, typically, 0.5–4 $cm^2$, a more complex thin-film circuit having a plurality of thin-film components such as transistors, diodes, capacitors or the like can be realized above the power MOSFET in the circuit arrangement of the invention without additional area being required for that purpose.

The manufacture of the circuit arrangement set forth with reference to FIG. 1 shall be described below with reference to FIGS. 2 through 4.

Figure 2:
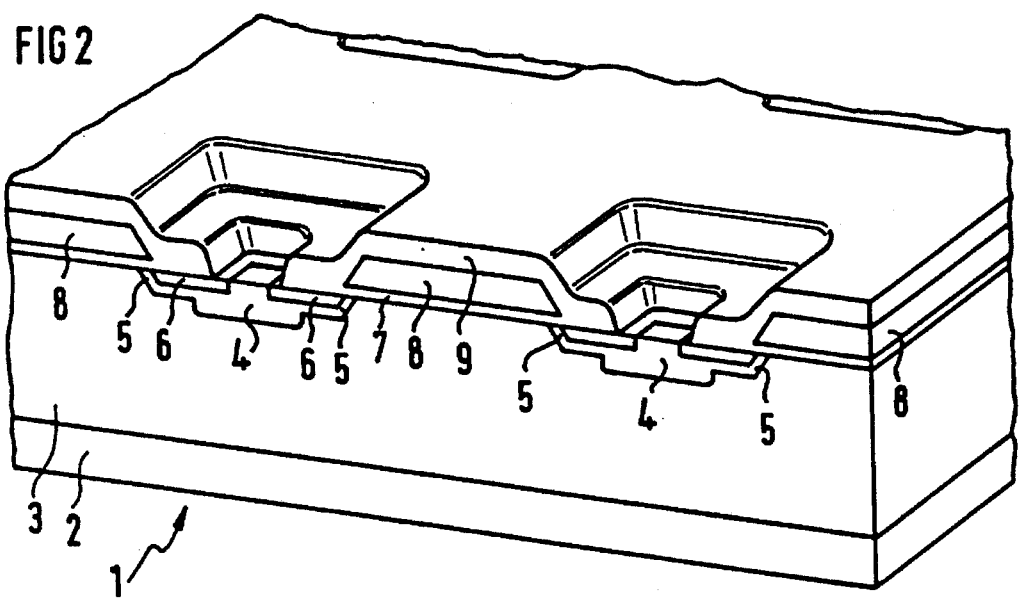
FIG. 2 shows a substrate having a power MOSFET after the manufacture of the buried gate electrode level.
Figure 3:
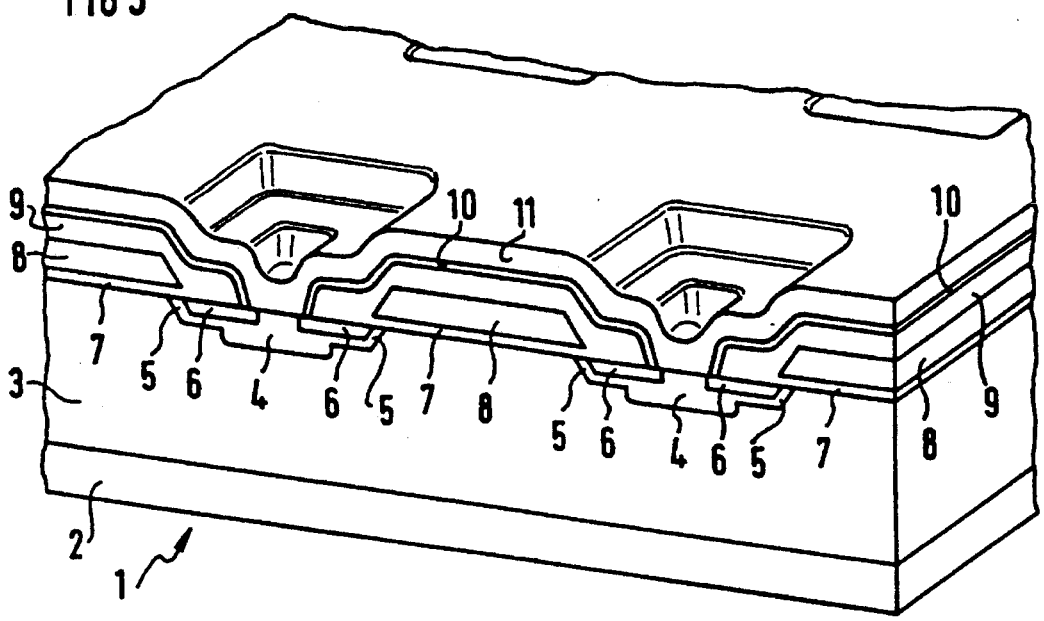
FIG. 3 shows the substrate with the power MOSFET after the manufacture of the source metallization.

First, as in the manufacture of a discrete power MOSFET, the $n^-$-doped region 3, the p-doped regions 4 that encompass the channel regions, and the $n^+$-doped source regions 6 are realized in an $n^+$-doped substrate 1 that represents the drain region 2 (see FIG. 2). The gate dielectric 7 is produced, for example, by thermal oxidation, on that principal surface of the substrate 1 lying opposite the drain region 2. It is produced at least in the region of the channel regions 5. The gate electrode level 8 that is an interconnected structure of doped polysilicon is formed by generating a doped polysilicon layer and by structuring the doped polysilicon layer. The gate electrode level 8 is completely covered by the insulating layer 9, whereby the surface of the source regions 6 and of the p-doped region 4 are at least partially uncovered.

In the next step, the manufacturing method deviates from the method that is standard for the manufacture of discrete power MOSFETs. Instead of the source metallization of aluminum that is usual given power MOSFETs, the source metallization level 11 is formed of a temperature-resistant conductor. For that purpose, the surface of the insulating layer 9 is first covered with a lower passivation layer 10 of, for example, titanium nitride. Subsequently, the source metallization level 11 is applied surface-wide, for example, by CVD deposition of tungsten (see FIG. 3).

Figure 4:
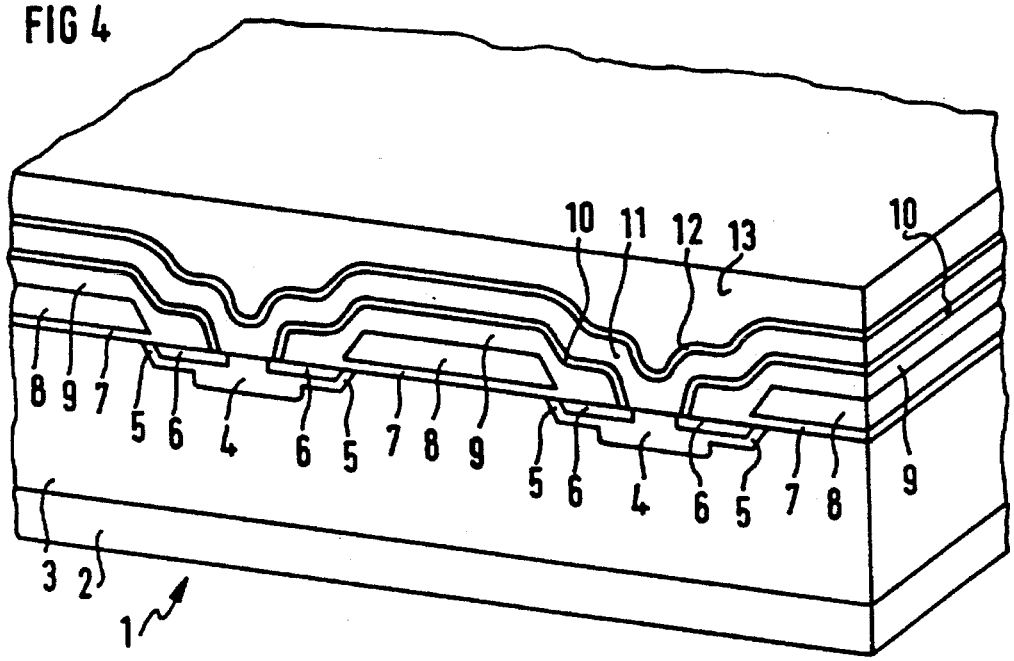
FIG. 4 shows the substrate with the power MOSFET after the manufacture of an insulation layer having a planar surface.

In order to avoid reactions of the tungsten with, in particular, $SiO_2$, the upper passivation layer 12 of, for example, nitride is applied onto the source metallization level 11 (see FIG. 4).

For forming the insulation layer 13, a relatively thick low-temperature $SiO_2$, for example, is subsequently deposited with a thickness of, for example, 800 nm in a plasma method or in a TEOS method. The low-temperature $SiO_2$ is planarized with lacquer and re-etching, so that the dielectric insulation layer 13 thereby arising comprises a planar surface. Instead of being formed of undoped $SiO_2$, the insulation layer 13 can also be formed of doped glass, for example, borophosphorous silicate glass with subsequent flowing at 900° C. for 5 minutes in a nitrogen atmosphere, or can be formed of a combination of $SiO_2$/borophosphorous silicate glass and re-etching. The planarization of the dielectric insulating layer 13 can also occur via an electrochemical polishing method. The planarization is important in order to level the topology produced by the buried gate electrode level 8.

The manufacture of the thin-film transistor or transistors occurs on the planar surface of the insulating layer 13. For that purpose, a polysilicon layer is formed, for example, by deposition of a 20–200 nm thick amorphous silicon layer and subsequent recrystallization and doping. By structuring the polysilicon layer, the regions arise for the source/drain regions 14, and the polysilicon body 15 also arises. The gate dielectric 16 is formed, for example, by thermal oxidation or by CVD deposition of a 40 nm thick $SiO_2$ layer. The gate electrode 17 of the thin-film transistor is formed by deposition of a 200 nm thick polysilicon layer that is $P^+$ or $n^+$ doped and by subsequent structuring. The gate electrode 17 is provided with the insulating spacers 18 by re-oxidation or by CVD oxide deposition. Finally, the source/drain regions 14 are formed by appropriate doping and activation of the dopant. The structure shown in FIG. 1 thus results.

Subsequently, the thin-film circuit is planarized with process steps that are standard in thin-film technology, are wired with aluminum, and are passivated. The electrical connection between the thin-film transistor and the power MOSFET can occur, for example, at the edge via a via hole that is filled with tungsten and that is provided with an aluminum metallization. The aluminum metallization can be simultaneously used for intensifying the contact of the source metallization level of the power MOSFET.

In the exemplary embodiment, the drain region 2 is shown at a surface of the substrate 1 that faces away from the thin-film transistor. The drain region 2 can also be arranged in the substrate 1 and can be laterally contacted via a buried layer in the substrate 1.

Although various minor changes and modifications might be suggested by those skilled in the art, it will be apparent that we wish to include within the scope of the patent warranted hereon all such changes and modifications as reasonably come within our contribution to the art.

We claim as our invention:

1. An integrated circuit arrangement, comprising:

at least one power component and a low-voltage component;

said at least one power component being integrated in a semiconductor substrate;

at least one contact of the power component being arranged on a principle surface of the substrate and a connection contact level connected to the contact and which extends across and above said principle surface;

an insulating layer covering the connection contact level; and at least one thin-film component formed of one of the elements selected from the group consisting of an amorphous semiconductor material and a polycrystalline semiconductor material as said low-voltage component positioned above the connection contact level and the at least one power component so that the connection contact level lies between the at least one power component and the at least one thin-film component so that the connection contact level shields the thin-film component against electrical fields occurring in the substrate.

2. A circuit arrangement according to claim 1 wherein:

the power component is MOS-controlled;

the power component comprises a source region that adjoins the principal surface and comprises a source electrode as said at least one contact that is arranged on the principal surface; and the thin-film component being arranged above the source electrode that is insulated from the thin-film component by the insulation layer.

3. A circuit arrangement according to claim 2 wherein:

the power component comprises a cell structure, a plurality of source regions at the principal surface and each of which adjoins at a respective channel region, and the channel regions also adjoining the principal surface, a gate dielectric and a gate electrode arranged over the principal surface;

the gate electrodes being connected to one another via a gate connection level;

the source electrodes being arranged on the principal surface and connected to one another via said connection contact level; and an insulating layer arranged between the gate electrodes and the connection contact level, said insulating layer insulating the gate electrodes and the gate connection level from the source electrodes and the connection contact level.

4. A circuit arrangement according to claim 3 wherein the source electrodes and the connection contact level are formed of a high-temperature-resistant conductor as a continuous source metallization level.

5. A circuit arrangement according to claim 4 wherein the source metallization level is formed of tungsten.

6. A circuit arrangement according to claim 4 wherein the source metallization level is formed of a metal silicide.

7. A circuit arrangement according to claim 1 wherein the insulation layer covering the contact comprises a planar surface on which the thin-film component is arranged.

8. A circuit arrangement according to claim 1 wherein at least one thin-film transistor is provided as a thin-film component.

9. An integrated circuit arrangement, comprising:

at least one power component integrated in a semiconductor substrate;

said power component having a region at a principal surface of the substrate to which is connected a contact metallization level which runs laterally over the principal surface of the substrate and over the at least one power component;

an insulation layer on the contact metallization level; and a thin film component on the insulation layer above the at least one power component, the contact metallization level being positioned between the thin film component and the at least one power component so that it shields the thin-film component against electrical fields occurring in the substrate associated with the at least one power component.

* * * * *